United States Patent
Fompeyrine et al.

(10) Patent No.: US 10,516,108 B2
(45) Date of Patent: *Dec. 24, 2019

(54) TUNABLE RESISTIVE ELEMENT

(71) Applicant: International Business Machines Corporation, Armonk, NY (US)

(72) Inventors: Jean Fompeyrine, Waedenswil (CH); Stefan Abel, Zurich (CH); Veeresh Vidyadhar Deshpande, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/287,262

(22) Filed: Feb. 27, 2019

(65) Prior Publication Data

US 2019/0312199 A1 Oct. 10, 2019

Related U.S. Application Data

(63) Continuation of application No. 15/948,043, filed on Apr. 9, 2018, now Pat. No. 10,312,441.

(51) Int. Cl.
*H01L 45/00* (2006.01)
*G11C 13/00* (2006.01)

(52) U.S. Cl.
CPC ........ *H01L 45/145* (2013.01); *G11C 13/0007* (2013.01); *H01L 45/12* (2013.01); *G11C 2213/50* (2013.01)

(58) Field of Classification Search
CPC ... H01L 45/12; H01L 45/145; G11C 13/0007; G11C 2213/50
See application file for complete search history.

(56) References Cited

U.S. PATENT DOCUMENTS

| | | | |
|---|---|---|---|
| 6,815,744 B1 * | 11/2004 | Beck | G11C 11/22 257/295 |
| 9,117,513 B2 | 8/2015 | Hwang et al. | |
| 9,246,094 B2 | 1/2016 | Wang et al. | |

(Continued)

OTHER PUBLICATIONS

Ye, C., et al., "Enhanced Resistive Switching Performance for Bilayer HfO2/TiO2 Resistive Random Access Memory", Semiconductor Science and Technology, Published Sep. 1, 2016, vol. 31, No. 10, http://iopscience.iop.org/article/10.1088/0268-1242/31/10/105005/meta, 3 pages (Abstract Only).

(Continued)

*Primary Examiner* — Harry W Byrne
*Assistant Examiner* — R Lance Reidlinger
(74) *Attorney, Agent, or Firm* — Scully, Scott, Murphy & Presser, P.C.; Daniel P. Morris, Esq.

(57) ABSTRACT

A tunable resistive element, comprising a first terminal, a second terminal, a dielectric layer and an intercalation layer. The dielectric layer and the intercalation layer are arranged in series between the first terminal and the second terminal. The dielectric layer is configured to form conductive filaments of oxygen vacancies on application of an electric field. The intercalation layer is configured to undergo a topotactic transition comprising an oxygen intercalation in combination with a change in the resistivity of the intercalation layer. A related memory device and a related neuromorphic network comprise resistive memory elements as memory cells and synapses respectively and a corresponding design structure.

20 Claims, 4 Drawing Sheets

20

(56) References Cited

U.S. PATENT DOCUMENTS 9,269,901 B2 2/2016 Hwang et al.
2008/0229269 A1 9/2008 Lamorey

OTHER PUBLICATIONS

Zhao, H., et al., "The Enhancement of Unipolar Resistive Switching Behavior via an Amorphous TiOx Layer Formation in Dy2O3 based Forming-Free RRAM", Solid State Electronics 2013, Accepted Jun. 21, 2013, pp. 12-16, vol. 89.

Park, K., e al., "Reliable Resistive Switching Memory based on Oxygen-Vacancy-Controlled Bilayer Structures", Royal Society of Chemistry, Accepted and first published on the web Feb. 16, 2016, 12 pages.

Beck, A., et al., "Reproducible switching effect in thin oxide films for memory applications", Applied Physics Letters, Jul. 3, 2000, pp. 139-141, vol. 77, No. 1.

Waser, R., et al., "Redox-Based Resistive Switching Memories—Nanoionic Mechanisms, Prospects, and Challenge", Advanced Materials, Jul. 2009, pp. 2632-2663, vol. 21.

Yang, J.J, et al., "Memristive devices for computing", Nature Nanotechnology, Published online Dec. 27, 2012, Jan. 2013, pp. 13-24, vol. 8.

Tambunan, O. T., et al., "Resistance switching in epitaxial SrCoOx thin films", Applied Physics Letters, Accepted Aug. 4, 2014, Published online Aug. 14, 2014, pp. 063507-1-063507-5, 105.

Acharya, S. K., et al., "Epitaxial Brownmillerite Oxide Thin Films for Reliable Switching Memory" ACS Applied Materials & Interfaces, Mar. 9, 2016, pp. 7902-7911, 8.

Jeen, H., et al., "Reversible redox reactions in an epitaxially stabilized SrCoOx oxygen sponge", Nature Materials, Published online Aug. 25, 2013, Nov. 2013, pp. 1057-1063, vol. 12.

Lu, Q., et al., "Voltage-Controlled Topotactic Phase Transition in Thin-Film SrCoOx Monitored by In Situ X-ray Diffraction", Nano Letters, 2016, Published online Dec. 21, 2015, pp. 1186-1193, 16.

Kinoshita, K. et al., "Finding Oxygen Reservoir by Using Extremely Small Test Cell Structure for Resistive Random Access Memory with Replaceable Bottom Electrode", Scientific Reports, Accepted Nov. 17, 2015, Published Dec. 22, 2015, pp. 1-8, 5:18442.

Jo, S.H. et al., "Nanoscale Memristor Device as Synapse in Neuromorphic Systems", Nano Letters, 2010, Received for review Dec. 10, 2009, Published online Mar. 1, 2010, pp. 1297-1301, 10.

List of IBM Patents or Patent Applications Treated as Related, dated Feb. 27, 2019, 2 pages.

\* cited by examiner

RESET

Intermediate

SET ized memory devices, a neuromorphic network comprising tunable resistive elements and a design structure.

TUNABLE RESISTIVE ELEMENT

BACKGROUND

The present application relates to a tunable resistive element.

The present application further concerns a related memory device comprising tunable resistive elements, a neuromorphic network comprising tunable resistive elements and a design structure.

Nanoscale memory devices, whose resistance depends on the history of the electric signals applied, could become critical building blocks in new computing paradigms, such as brain-inspired computing and memcomputing.

One of the leading solution is Resistive RAM (RRAM). It involves creating filaments of e.g. oxygen vacancies in dielectrics such as HfO2, using a process called soft breakdown. The filaments are subsequently closed (SET) or opened (RESET) during operation. Strongly reducing metals, e.g. titanium, may be used as one of the electrodes to enhance the formation of the filament. However, the SET process is rather local and abrupt, due to the filamentary nature of the switching and the difficulty to exchange oxygen with the electrode Accordingly, there is a need for further improvements of resistive elements.

SUMMARY

According to a first aspect, the invention is embodied as a tunable resistive element, comprising a first terminal, a second terminal, a dielectric layer and an intercalation layer. The dielectric layer and the intercalation layer are arranged in series between the first terminal and the second terminal. The dielectric layer is configured to form conductive filaments of oxygen vacancies on application of an electrical signal. The intercalation layer is configured to undergo a topotactic transition comprising an oxygen intercalation in combination with a change in the resistivity of the intercalation layer.

According to an embodiment of another aspect, a design structure is provided. The design structure is tangibly embodied in a machine readable medium for designing, manufacturing, or testing an integrated circuit. The design structure comprises a tunable resistive element according to the first aspect.

Further aspects relate to a memory device comprising a plurality of resistive elements according to the first aspect and a neuromorphic network comprising a plurality of resistive elements according to the first aspect.

Embodiments of the invention will be described in more detail below, by way of illustrative and non-limiting examples, with reference to the accompanying drawings.

DETAILED DESCRIPTION

Figure 1:
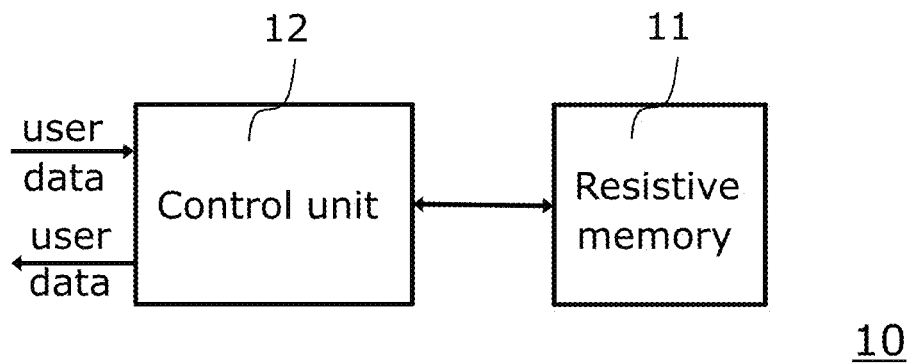
FIG. 1 illustrates a block diagram of a memory device according to an embodiment of the invention.

In reference to FIGS. 1-6, some general aspects and terms of embodiments of the invention are described.

According to embodiments of the invention, a resistive material may be defined as a material whose electrical resistance can be changed by applying an electrical signal to the resistive material. The electrical signal may be e.g. a current flowing through the device, or an electrical voltage applied to the resistive material. The current and/or voltage may be e.g. applied to the resistive element in the form of pulses. As a result, the electrical resistance of a resistive element depends on the history of the electric signal that had been applied to the resistive memory element.

Resistive materials may be in particular used as memory elements. Accordingly, resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material. These resistive memory elements exhibit good performance in terms of power consumption, integration density potential, retention, and endurance.

One particular promising example for resistive memory devices are resistive random-access memories (RRAM). This is a non-volatile memory technology in which the fundamental storage unit (the "cell") comprises a RRAM material located between a pair of electrodes. The RRAM material in these cells normally presents a high resistance to electric current. Due its properties or in combination with electrode materials, it is a particular property of RRAM cells that a low resistance region path can be formed within the high-resistance matrix by application of a suitable electrical signal, in particular a voltage, to the electrodes. In the specific case of filament-based technologies such as CBRAM (Conductive-bridge RAM) or OxRAM (Oxide-based RAM), the low resistance region is a conductive path between both electrodes, e.g. formed by oxygen vacancies in OxRAM. This conductive path extends through the matrix in a direction between the electrodes. The conductive path can be broken or eliminated by application of another, "RESET" signal to the electrodes, returning the cell to the high-resistance RESET state. Hence by appropriate application of SET and RESET pulses in one or more data write operation, individual cells can be programmed into states with measurably-different resistance values. The programmed cell state can be determined in a read operation using cell resistance as a metric for cell state. On application of a read voltage to the electrodes, the current which flows through the cell depends on the cell's resistance, whereby cell current can be measured to determine the cell state. The read voltage is usually significantly lower than the write voltage used for programming so that the read operation does not disturb the programmed cell state.

While generally the conductive path can be formed by a number of different mechanisms in RRAM cells, embodiments of the invention use in particular conductive path formation by oxygen vacancies, resulting from migration of oxygen ions in the insulating matrix.

A topotactic transition may be defined as a chemical solid-state reaction of an initial crystal such that the orientations of the resulting crystal is determined by the orientation of the initial crystal. In other words, a topotactic transition may involve a structural change to a crystalline solid, which may include loss or gain of material, so that the final lattice is related to that of the original material by one or more crystallographically equivalent, orientational relationships. According to embodiments, the topotactic transition is associated with a change in the electrical resistivity of the material.

An intercalation may be defined as a process whereby guest molecules or ions are inserted into a host material, thereby forming an intercalation compound structure. The host material may have in particular a lattice-structure. The intercalation compound structure is preferably only slightly perturbed from the host structure and the reaction used to form the compound is reversible. According to embodiments the guest molecules are in particular oxygen ions.

FIG. 1 is a simplified schematic block diagram of a memory device 10 embodying the invention in one embodiment. The memory device 10 includes a multilevel resistive memory 11 for storing data in one or more integrated arrays of resistive memory elements described below. Reading and writing of data to memory 11 is performed by a control unit 12. Control unit 12 comprises circuitry of generally known form for programming resistive memory elements during data write operations and making read measurements for detecting element-state during data read operations. During these operations, the control unit can address individual resistive memory elements by applying appropriate control signals to an array of word and bit lines in the resistive memory 11. User data input to device 10 may be subjected to some form of write-processing, such as coding for error-correction purposes, before being supplied as write signal, in particular as write voltage, to the resistive memory 11. Similarly, read signals received from the resistive memory 11 may be processed by a read-processing module of the control unit 12, e.g. for code-word detection and/or error correction, to recover the original input user data.

Figure 2:
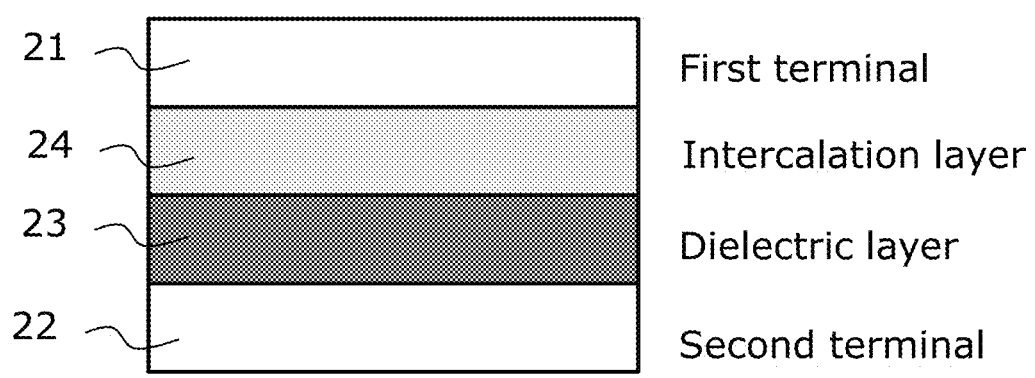
FIG. 2 shows a schematic cross sectional view of a tunable resistive element according to an embodiment of the invention.

FIG. 2 is a simplified cross sectional view of a tunable resistive element 20 according to an embodiment of the invention. It comprises a first terminal 21, a second terminal 22, a dielectric layer 23 and an intercalation layer 24. The dielectric layer 23 and the intercalation layer 24 are electrically arranged in series between the first terminal 21 and the second terminal 22. The intercalation layer 24 may comprise a perovskite or derivative, in particular $SrCoO_{3-x}$, $SrFrO_{3-x}$, $SrMnO_{3-x}$, $CaCrO_{3-x}$, $BaInO_{3-x}$, $BaZrO_{3-x}$, $SrTiO_{3-x}$, (with $0.5<x<1$) or $La_2NiO_{4+x}$, $La_2CuO_{4+x}$, with ($0<x<0.3$) The dielectric layer 23 may comprise a metal-oxide material, in particular $TiO_2$, $HfO_2$, $CeO_2$ or $RE_2O_3$ (RE=Rare earth).

The first terminal 21 and the second terminal 22 each comprise a metal, in particular Ti, TiN, TaN, W, Pt or any metallic oxide such as $WO_3$, $RuO_2$ and ITO.

The dielectric layer 23 may be preferably embodied with a thickness in the z-direction between 5 nm and 50 nm. The intercalation layer 24 may be preferably embodied with a thickness in the z-direction between 5 nm and 50 nm.

The dielectric layer 23 is configured to form conductive filaments of oxygen vacancies on application of an electric signal, e.g. an electric current or voltage. The intercalation layer 24 is configured to undergo a topotactic transition comprising an oxygen intercalation in combination with a change in the resistivity of the intercalation layer 24 as will be described below in more detail.

According to some embodiments, a plurality of the resistive elements 20 may be implemented in the resistive memory 11 and the control unit 12 of the memory device 10 may be configured to apply in a write mode one or more write signals, in particular write voltages, to the first terminal 21 and the second terminal 22 for writing a resistance state. In addition, the control unit 12 may apply in a read mode a read signal, in particular a read voltage, to the first terminal 21 and the second terminal 22 for reading the resistance state.

The write signals may be embodied in particular as electrical set pulses and electrical reset pulses. By applying the electrical set pulses to the resistive elements, conductive filaments of oxygen vacancies can be formed in the dielectric layer 23 as well as conductive oxygen paths between the conductive filaments and the first terminal 21. Furthermore, by applying one or more electrical reset pulses to the resistive elements 20 the oxygen in the conductive filaments can be exchanged with the intercalation layer 24 and the dielectric layer 23. According to embodiments, the control unit 20 may program the resistance state of the resistive elements 20 in particular by an iterative program and verify procedure.

The programming of the resistance state will be explained in more detail with reference to FIGS. 3a to 3c.

Figure 3A:
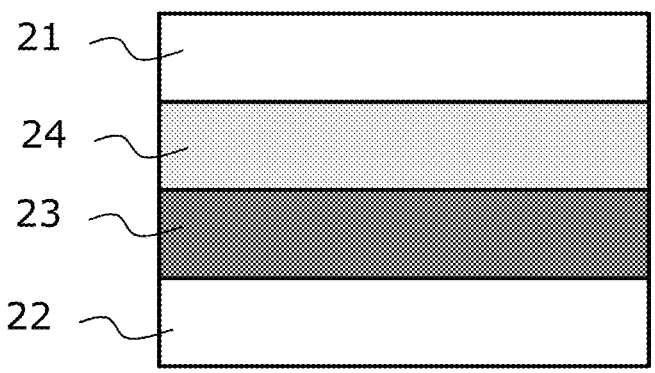
FIG. 3a shows a schematic cross sectional view of a tunable resistive element in a first resistance state, which is a high resistance state and may also be denoted as RESET-state.

FIG. 3a shows a schematic cross-sectional view of the tunable resistive element 20 in a first resistance state. The first resistance state is a high resistance RESET state. In the first resistance state, no conductive filaments have been formed in the dielectric layer 23. The first resistance state may be considered as an initial state of the resistive element 20, i.e. before any electrical field or any electrical programming pulses have been applied to the resistive element 20. Furthermore, the first resistance state can be reached by the application of one or more electrical reset-pulses to the resistive element 20. These electrical reset-pulses bring the resistive element 20 back to its original state. The first resistance state is characterized by a low oxygen level in the intercalation layer 24 and a fully oxidized dielectric layer 23. In other words, in the first resistance state, no oxygen has been transferred yet from the dielectric layer 23 to the intercalation layer 24.

Figure 3B:
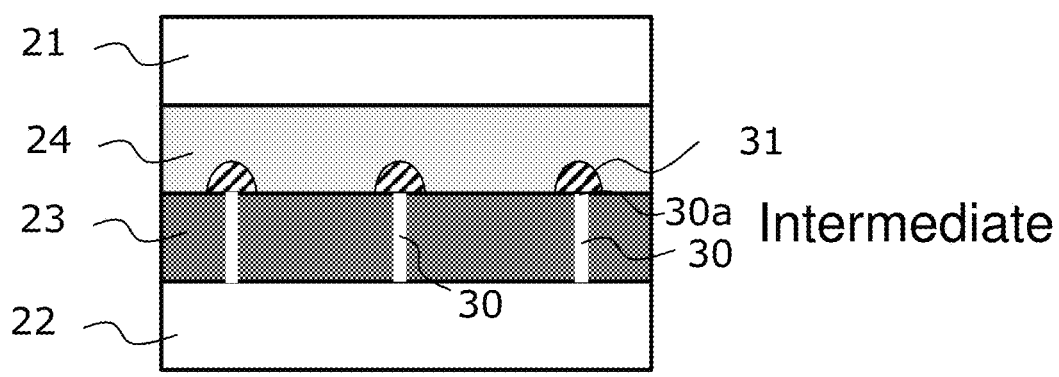
FIG. 3b shows a schematic cross sectional view of a tunable resistive element in an intermediate resistance state.

FIG. 3b shows a schematic cross-sectional view of the tunable resistive element 20 in an intermediate resistance state. The intermediate resistance state is characterized by conductive filaments 30 of oxygen vacancies in the dielectric layer 23 and a plurality of oxygen regions 31 extending from the conductive filaments 30 in the intercalation layer 24 towards the first terminal 21. Starting from the resistive element in the RESET state as shown in FIG. 3a, the conductive filaments 30 and the oxygen regions 31 can be formed by the application of one or more electrical set-pulses. The corresponding process for creating the conductive filaments 30 is known as soft breakdown. On the application of the one or more set pulses, the dielectric layer 23 and the intercalation layer 24 exchange oxygen. In other words, the oxygen that has been released while creating the oxygen vacancies of the conductive filaments 30 is transferred and assembled in the oxygen regions 31 of the intercalation layer 24. The oxygen regions 31 may have various geometries which may depend e.g. on the respective material of the intercalation layer 24. The oxygen regions 31 start to grow from the upper end 30a of the conductive filaments 30 and grow towards the first terminal 21. Hence according to embodiments, the conductive filaments 30 in the dielectric layer 23 are formed first and then the oxygen regions 31 start to grow from the upper end 30a of the conductive filaments 30 to establish a complete conducting path between the first terminal 21 and the second terminal 22.

According to embodiments, the dielectric layer 23 may comprise conductive filaments that have been already preformed or preconfigured in a fabrication process during fabrication of the tunable resistive element. This may facilitate the tuning of the resistance. As an example, the conductive filaments may be first created by applying an electric field across the dielectric layer 23. This may be facilitated by depositing a temporary electrode/terminal on the dielectric layer 23. The fabrication process may then continue by steps of removing the temporary electrode, depositing the intercalation layer 24 on the dielectric layer 23, and depositing the second, final terminal 22.

The intercalation layer 24 is configured to undergo a topotactic transition. The topotactic transition comprises an oxygen intercalation in combination with a change in the resistivity of the intercalation layer 24. More particularly, the intercalation layer 24 provides a decreasing resistance with an increasing oxygen level. In other words, the higher the oxygen level, the lower the resistance of the oxygen intercalation layer 24. In this respect, the intercalation layer 24 provides an opposite behavior with respect to the oxygen content than the dielectric layer 23. More particularly, the dielectric layer 23 provides a decreasing resistance with a decreasing oxygen level, namely with the formation of the conductive filaments of oxygen vacancies. Hence according to such an embodied configuration, the dielectric layer 23 and the intercalation layer 24 provide a cooperative or in other words synergistic characteristic with respect to the oxygen exchange.

One idea of embodiments of the invention is that the "connection" area to the electrodes is spatially broadened by the introduction of the intercalation layer 24. More particularly, compared with the tip of a filament as in prior art solutions, embodiments of the invention provide a larger "connection" area to the electrodes.

Figure 3C:
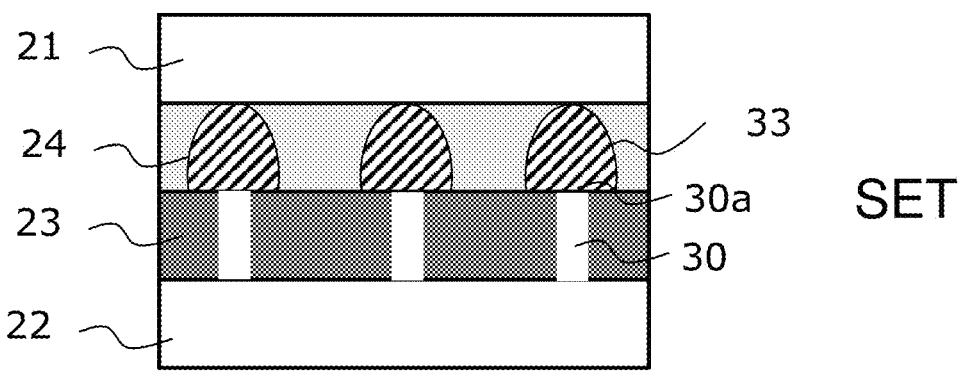
FIG. 3c shows a schematic cross sectional view of a tunable resistive element in a second resistance state, which is a low resistance state and may also be denoted as SET-state.

FIG. 3c shows a schematic cross-sectional view of a tunable resistive element in a second resistance state, which is a low resistance state and may also be denoted as SET-state.

The second resistance state may be reached, starting from the first resistance state, by the application of one or more set-pulses to the first terminal 21 and the second terminal 22. The second resistance state is characterized by a plurality of oxygen paths 33 in the intercalation layer 24. The oxygen paths 33 form oxygen rich regions and extend from the upper end 30a of the conductive filaments 30 to the first terminal 21. In other words, the oxygen paths 33 provide in the second low resistance state a full conductive path between the upper end 30a of the conductive filaments 30 and the first terminal 21. Compared with the conductive filament 30 of the intermediate resistance state as illustrated in FIG. 3b, the conductive filaments 30 have been enlarged in the low resistance second resistance state. In particular, the conductive filaments 30 comprise a higher number of oxygen vacancies in the second low resistance state than in the intermediate resistance states. This may result in particular in a larger width and larger cross section of the conductive filaments 30 in the second resistance state than in the intermediate resistance states.

By the application of one or more reset pulses, the resistive element 20 can be brought back via one or more intermediate resistance state as illustrated in FIG. 3b to the high resistance RESET state as illustrated in FIG. 3a.

The intercalation layer 24 is in particular configured such that a difference in the free energy of the intercalation layer in the first resistance state and the second resistance state is rather low. According to preferred embodiments the difference in the energy levels is between 0.1 eV and 1 eV. Such an embodiment facilitates the oxygen intercalation in the intercalation layer 24. More particularly, according to such an embodiment the oxygen can be exchanged between the intercalation layer 24 and the dielectric layer 23 with rather little energy.

Figure 4:
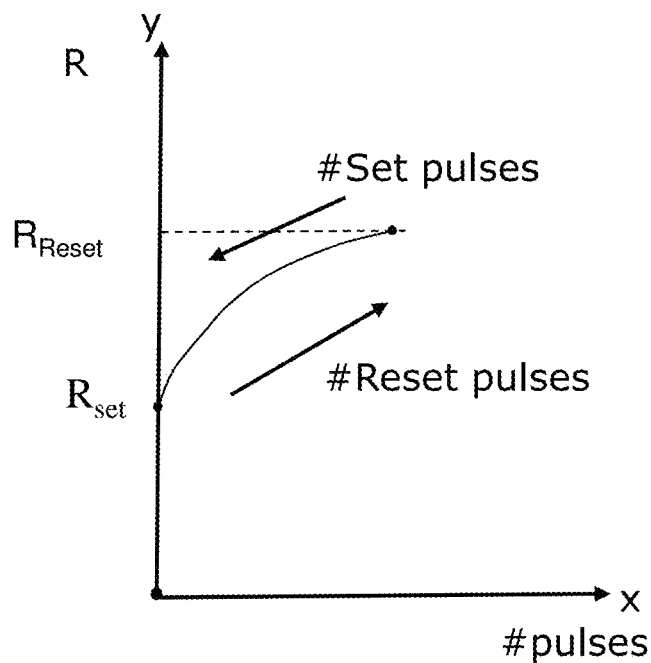
FIG. 4 shows an exemplary example of a resistance curve of resistive elements according to embodiments of the invention.

FIG. 4 shows an exemplary example of a resistance curve of resistive elements according to embodiments of the invention. The y-axis denotes the resistance and the x-axis the number of set pulses or reset pulses applied to the resistive element. The resistance of the resistive element can be changed between a low second resistance $R_{set}$ and high first resistance $R_{Reset}$.

By the application of reset pulses, the resistance can be increased and by the application of set pulses the resistance can be decreased. In this respect, embodiments of the invention may provide a non-hysteretic behavior of the resistive elements which facilitates a bi-directional programming of resistance values of the resistive elements. In other words, the resistive element provides according to embodiments a substantially symmetric bidirectional resistance curve on application of set-pulses and reset pulses. Hence, embodiments of the invention provide a continuously tunable resistor as 2 terminal device.

Figure 5:
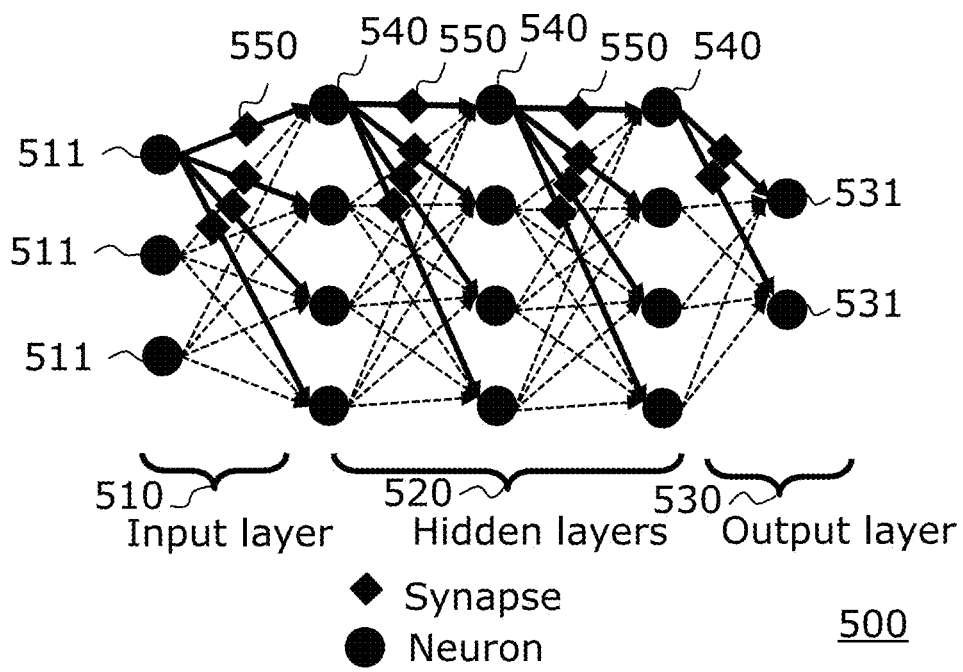
FIG. 5 shows a neuromorphic network according to an embodiment of the invention.

FIG. 5 shows a neuromorphic network 500 according to an embodiment of the invention. The neuromorphic network 500 comprises an input layer 510, a hidden layer 520 and an output layer 530. The input layer 510 comprises a plurality of input nodes 511 and the output layer 530 comprises a plurality of output nodes 531. The hidden layer 520 comprises a plurality of neurons 540 and a plurality of synapses 550. The synapses 550 may be embodied as resistive elements, e.g. as the resistive element 20 as described with reference to FIGS. 2, 3a, 3b and 3c. The tunable resistive elements according to embodiments of the invention are in particular suited to work as synapses in view of their symmetric resistance behavior as illustrated with reference to FIG. 4.

Figure 6:
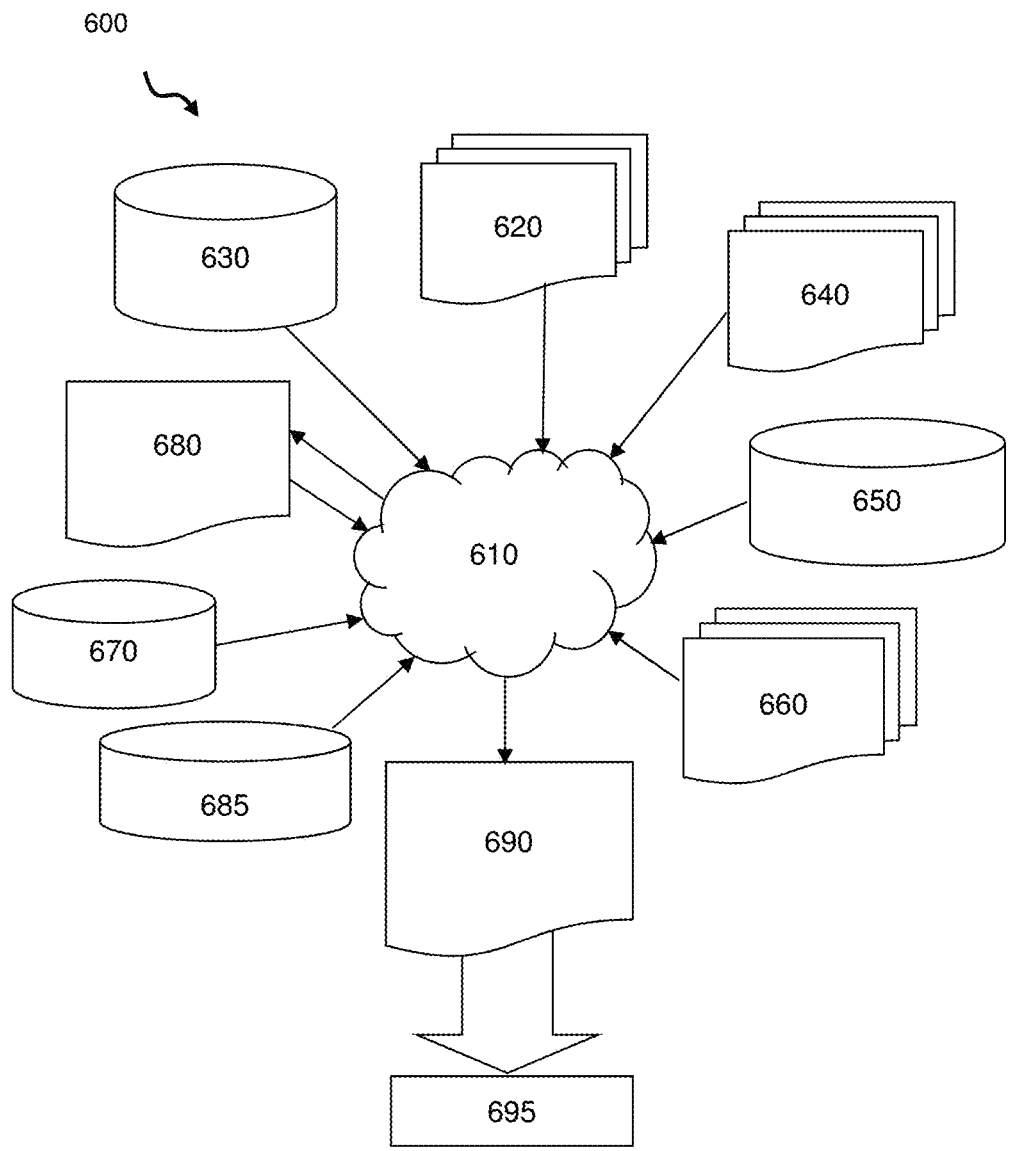
FIG. 6 shows a design structure according to an embodiment of the invention.

FIG. 6 shows a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown e.g. in FIGS. 1 to 5. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1 to 5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1-5 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 670. Design structure 690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 to 5. In one embodiment, design structure 690 may comprise a compiled, executable HDL simulation model that functionally simulates the devices shown in FIGS. 1-5.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 690 may then proceed to a stage 695 where, for example, design structure 690: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A method, comprising:
   forming a dielectric layer and an intercalation layer between a first terminal and a second terminal,
   wherein the dielectric layer is configured to form conductive filaments of oxygen vacancies, and
   wherein the intercalation layer is configured to undergo a topotactic transition comprising an oxygen intercalation in combination with a change in the resistivity of the intercalation layer.

2. The method of claim 1, wherein the dielectric layer and the intercalation layer are arranged in series between the first terminal and the second terminal.

3. The method of claim 1, wherein the intercalation layer is configured to provide a decreasing resistance with an increasing oxygen level.

4. The method of claim 1, wherein the method forms a tunable resistive element.

5. The method of claim 4, wherein the tunable resistive element is configured to at least:
   provide a first resistance state on application of one or electrical reset-pulses to the resistive element, the first resistance state being characterized by a low oxygen level in the intercalation layer and a fully oxidized dielectric layer; and
   provide a second resistance state on application of one or more set-pulses, the second resistance state being characterized by a plurality of oxygen paths in the intercalation layer between the dielectric layer and the first or the second terminal, and by conductive filaments of oxygen vacancies in the dielectric layer.

6. The method of claim 4, wherein the tunable resistive element is configured to at least:
   provide an intermediate resistance state on application of a set-pulse, the intermediate resistance state being characterized by conductive filaments of oxygen vacancies in the dielectric layer and a plurality of oxygen regions extending from the conductive filaments in the intercalation layer towards the first or the second terminal.

7. The method of claim 4, wherein the tunable resistive element is configured to at least:
   provide an intermediate resistance state on application of a reset-pulse, the intermediate resistance state being characterized by conductive filaments of oxygen vacancies in the dielectric layer and a plurality of oxygen regions extending from the conductive filaments in the intercalation layer towards the first or the second terminal.

8. The method of claim 1, wherein the dielectric layer comprises conductive filaments being preformed in a fabrication process.

9. The method of claim 6, wherein the intercalation layer is configured such that a difference in free energy levels between the intercalated and not-intercalated layer in the first resistance state and the second resistance state is below 1 eV.

10. The method of claim 7, wherein the intercalation layer is configured such that a difference in free energy levels between the intercalated and not-intercalated layer in the first resistance state and the second resistance state is below 1 eV.

11. The method of claim 1, wherein the intercalation layer comprises a perovskite or derivatives thereof.

12. The method of claim 1, wherein the intercalation layer comprises a material selected from the group consisting of: $SrCoO_{3-x}$, $SrFrO_{3-x}$, $SrMnO_{3-x}$, $CaCrO_{3-x}$, $BaInO_{3-x}$, $BaZrO_{3-x}$, $SrTiO_{3-x}$, (with $0.5<x<1$) and $La_2NiO_{4+x}$, $La_2CuO_{4+x}$, with ($0<x<0.3$).

13. The method of claim 1, wherein the dielectric layer comprises a metal-oxide material.

14. The method of claim 13, wherein the metal oxide material is selected from the group consisting of: $TiO_2$, $HfO_2$, $CeO_2$ and $RE_2O_3$, wherein RE is a rare earth material.

15. The method of claim 1, wherein the first terminal and/or the second terminal comprises a metal or metal-oxide.

16. The method of claim 15, wherein the metal or metal-oxide is selected from the group consisting of Ti, TiN, TaN, W, $WO_3$, $RuO_2$ and ITO.

17. The method of claim 1, wherein the dielectric layer has a thickness between 5 nm and 50 nm.

18. The method of claim 1, wherein the intercalation layer has a thickness between 5 nm and 50 nm.

19. The method of claim 6, wherein the resistive element is configured to provide a bidirectional resistance curve on application of the set-pulse.

20. The method of claim 7, wherein the resistive element is configured to provide a bidirectional resistance curve on application of the reset pulse.

* * * * *